(12) United States Patent
Chou

(10) Patent No.: US 11,088,095 B2
(45) Date of Patent: Aug. 10, 2021

(54) PACKAGE STRUCTURE

(71) Applicant: NANYA TECHNOLOGY CORPORATION, New Taipei (TW)

(72) Inventor: Liang-Pin Chou, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/295,397

(22) Filed: Mar. 7, 2019

(65) Prior Publication Data

US 2020/0185341 A1    Jun. 11, 2020

Related U.S. Application Data

(60) Provisional application No. 62/776,544, filed on Dec. 7, 2018.

(51) Int. Cl.
*H01L 23/60* (2006.01)
*H01L 23/00* (2006.01)
(Continued)

(52) U.S. Cl.
CPC ............ *H01L 23/60* (2013.01); *H01L 21/561* (2013.01); *H01L 21/565* (2013.01);
(Continued)

(58) Field of Classification Search
CPC ... H01L 23/60; H01L 23/5223; H01L 21/565; H01L 2224/02379; H01L 23/562;
(Continued)

(56) References Cited

U.S. PATENT DOCUMENTS 9,006,888 B2 *  4/2015  Shim ................... H01L 21/568
                                                          257/737
9,153,544 B2 * 10/2015  Pagaila ................ H01L 24/19
                        (Continued)

FOREIGN PATENT DOCUMENTS

TW        201705442 A     2/2017
TW        201705442 A     2/2017

OTHER PUBLICATIONS

Office Action dated May 27, 2020 related to Taiwanese Application No. 108113384.
(Continued)

*Primary Examiner* — Latanya N Crawford Eason
(74) *Attorney, Agent, or Firm* — Muncy, Geissler, Olds & Lowe, P.C.

(57) ABSTRACT

The present disclosure relates to a package structure. The package structure includes a semiconductor device, a first molding compound, a through-via, first and second dielectric layers, and a second molding compound in contact with a sidewall of the first dielectric layer. The first molding compound is in contact with a sidewall of the semiconductor device. The through-via is formed in the first molding compound and electrically connected to the semiconductor device. The first and second dielectric layers are formed at upper and lower sides of the semiconductor device. The at least one redistribution line is formed in the first dielectric layer and electrically connected to the semiconductor device and the through-via. The second molding compound is in contact with a sidewall of the first dielectric layer. The at least one redistribution line comprises an ESD-protection feature or a MIM (metal-insulator-metal) feature.

15 Claims, 19 Drawing Sheets

(51) Int. Cl.
*H01L 23/522* (2006.01)
*H01L 23/48* (2006.01)
*H01L 23/528* (2006.01)
*H01L 23/31* (2006.01)
*H01L 21/56* (2006.01)

(52) U.S. Cl.
CPC ........ *H01L 23/3128* (2013.01); *H01L 23/481* (2013.01); *H01L 23/5223* (2013.01); *H01L 23/5283* (2013.01); *H01L 24/09* (2013.01); *H01L 24/17* (2013.01); *H01L 24/29* (2013.01); *H01L 24/73* (2013.01); *H01L 24/97* (2013.01); *H01L 2224/02373* (2013.01); *H01L 2224/02375* (2013.01); *H01L 2224/02379* (2013.01); *H01L 2224/02381* (2013.01); *H01L 2924/1205* (2013.01); *H01L 2924/30205* (2013.01)

(58) Field of Classification Search
CPC ... H01L 23/3135; H01L 23/642; H01L 24/17; H01L 24/29; H01L 24/73; H01L 24/97; H01L 23/481; H01L 23/5283; H01L 23/3128; H01L 21/561; H01L 24/09; H01L 2924/30205; H01L 2224/02381; H01L 2224/02375; H01L 2224/02373; H01L 2924/1205
See application file for complete search history.

(56) References Cited

U.S. PATENT DOCUMENTS

| | | | |
|---|---|---|---|
| 9,553,062 B1 | 1/2017 | Fan et al. | |
| 10,177,125 B2* | 1/2019 | Lin | H01L 25/16 |
| 10,262,967 B2* | 4/2019 | Hwang | H01L 28/90 |
| 10,269,691 B2* | 4/2019 | Liao | H01G 4/306 |
| 10,468,339 B2* | 11/2019 | Tsai | H01L 23/49816 |
| 2012/0018882 A1* | 1/2012 | Shim | H01L 21/568 |
| | | | 257/737 |
| 2012/0133032 A1* | 5/2012 | Tsai | H01L 21/561 |
| | | | 257/659 |
| 2015/0221714 A1 | 8/2015 | Gu et al. | |
| 2016/0066426 A1* | 3/2016 | Chen | H01L 21/565 |
| | | | 361/820 |
| 2017/0278832 A1* | 9/2017 | Lin | H01L 23/49822 |
| 2018/0130793 A1 | 5/2018 | Peitz | |
| 2018/0286776 A1 | 10/2018 | Tai et al. | |
| 2018/0337122 A1 | 11/2018 | Liao et al. | |
| 2019/0057949 A1* | 2/2019 | Hwang | H01L 23/49822 |
| 2019/0244887 A1* | 8/2019 | Chen | H01L 21/4853 |
| 2019/0341373 A1* | 11/2019 | Yu | H01L 21/6835 |

OTHER PUBLICATIONS

Taiwan Office Action dated Jan. 28, 2021, as issued in corresponding TW Patent Application No. 108113384, 5 pages.

* cited by examiner

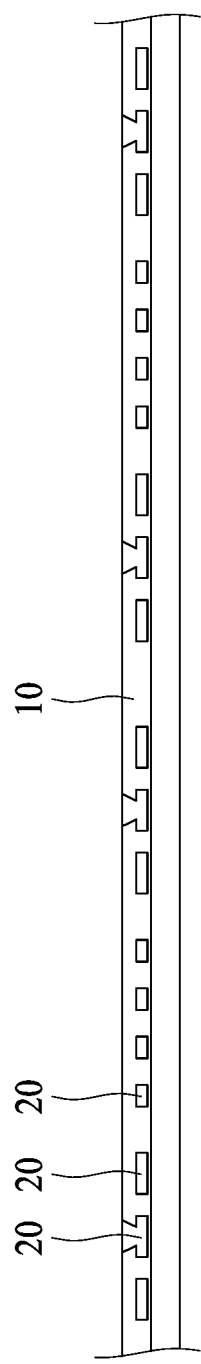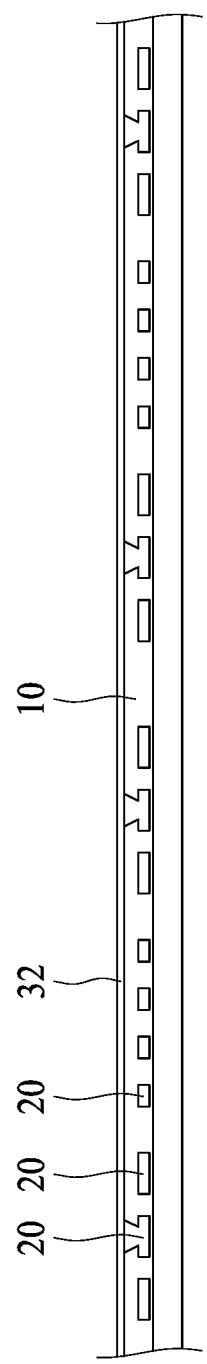

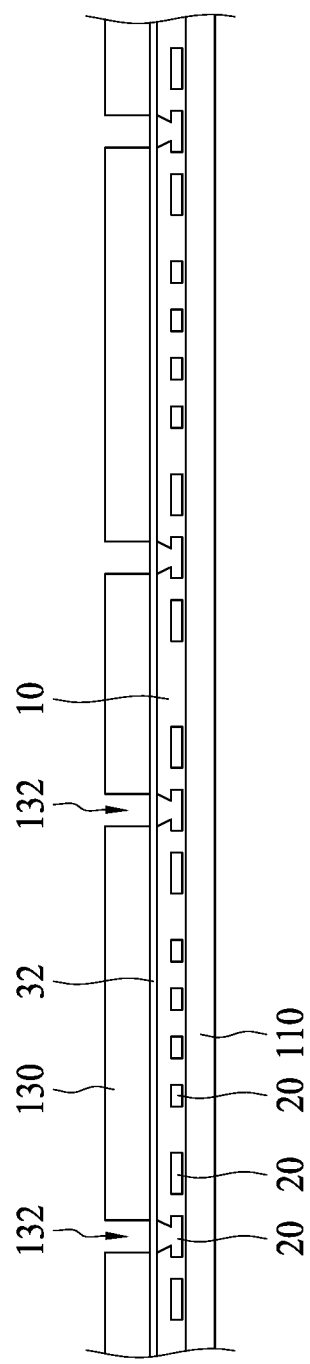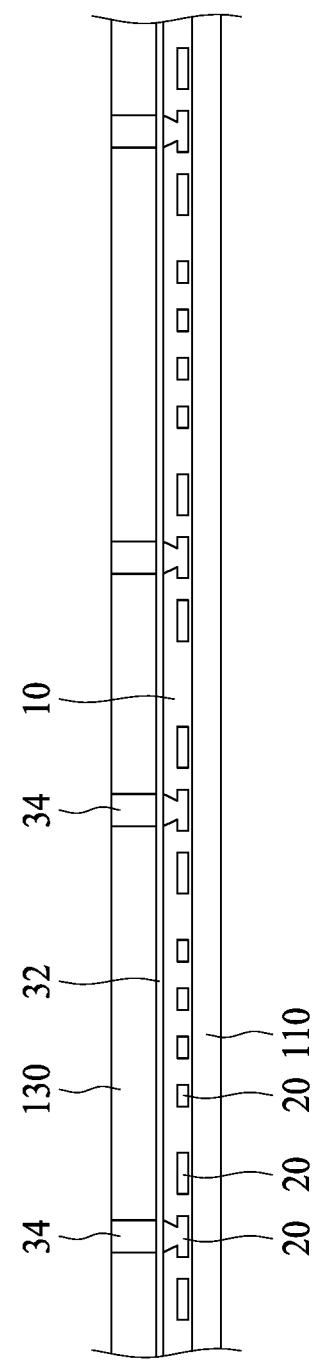

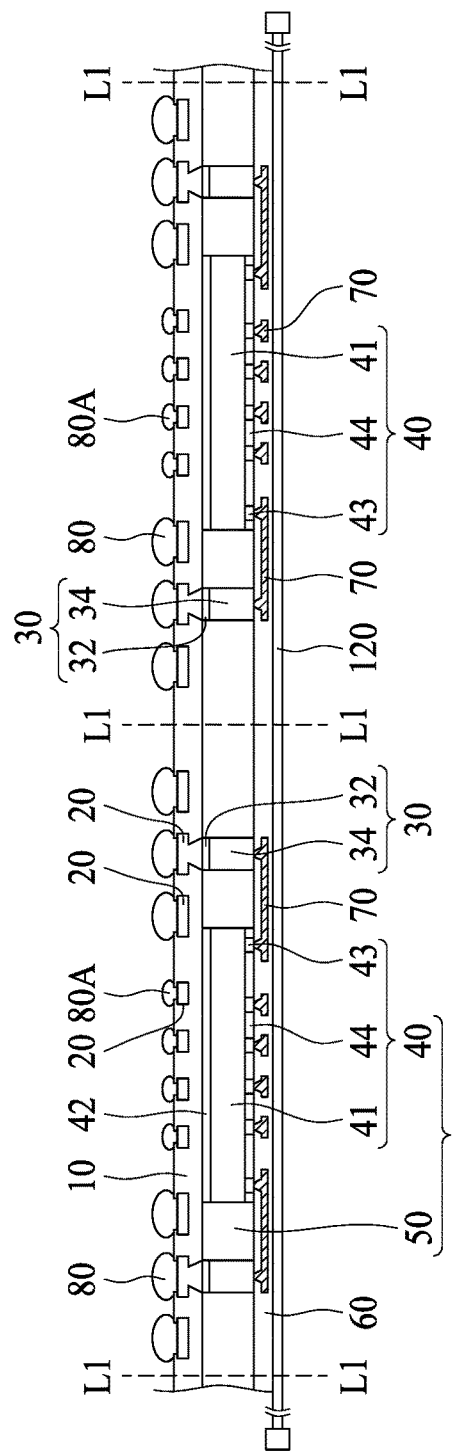
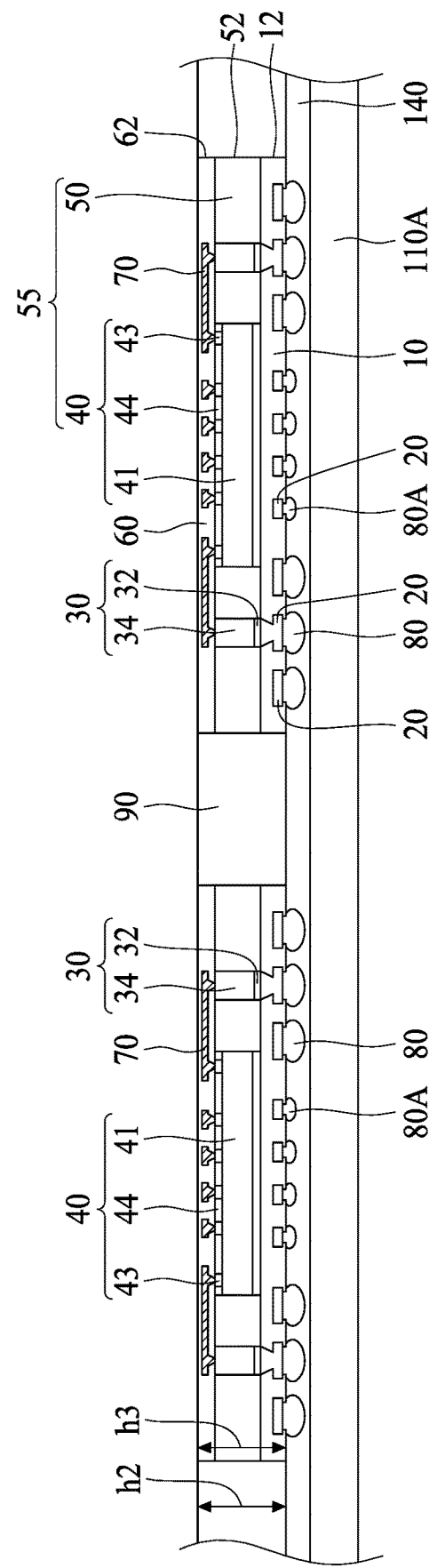
FIG. 12
FIG. 13

PACKAGE STRUCTURE

PRIORITY CLAIM AND CROSS-REFERENCE

This application claims the priority benefit of U.S. provisional application Ser. No. 62/776,544, filed on Dec. 7, 2018. The entirety of the above-mentioned patent application is hereby incorporated by reference herein and made a part of this specification.

TECHNICAL FIELD

The present disclosure relates to a package structure, and more particularly, to a package structure having at least one redistribution line which comprises an ESD-protection feature or a MIM (metal-insulator-metal) feature.

DISCUSSION OF THE BACKGROUND

The semiconductor industry continues to improve the integration density of various electronic components (e.g., transistors, diodes, resistors, capacitors, etc.) by continual reduction of minimum feature size, which allows more components to be integrated into a given area. These smaller electronic components are also configured with smaller packages in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

Certain electronic circuits can be exposed to overvoltage or undervoltage conditions. The overvoltage or undervoltage conditions can include, for example, electro static discharge (ESD) events arising from the abrupt release of charge from an object or person to an electronic system.

Such overvoltage or undervoltage conditions can damage electronic circuits or adversely affect the operations of the circuits. Various protection circuits have been developed to provide protection of electronic circuits from overvoltage or undervoltage conditions.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a package structure. The package structure includes a semiconductor device, a first molding compound, a through-via, first and second dielectric layers, and a second molding compound in contact with a sidewall of the first dielectric layer. The first molding compound is in contact with a sidewall of the semiconductor device. The through-via is formed in the first molding compound and electrically connected to the semiconductor device. The first and second dielectric layers are formed at upper and lower sides of the semiconductor device. The at least one redistribution line is formed in the first dielectric layer and electrically connected to the semiconductor device and the through-via. The second molding compound is in contact with a sidewall of the first dielectric layer. The at least one redistribution line comprises an ESD-protection feature or a MIM (metal-insulator-metal) feature.

In some embodiments, the at least one redistribution line comprises the ESD-protection feature, and the ESD-protection feature is an ESD-protection layer.

In some embodiments, the ESD-protection layer is formed in the first dielectric layer.

In some embodiments, the ESD-protection layer is insulated from the at least one redistribution line.

In some embodiments, the at least one redistribution line, the through-via and the semiconductor device are surrounded by the ESD-protection layer.

In some embodiments, a top view of the ESD-protection layer is substantially rectangular.

In some embodiments, at least one side of the rectangular ESD-protection layer is wavy.

In some embodiments, the ESD-protection layer is formed under and spaced apart from the at least one redistribution line.

In some embodiments, the ESD-protection layer is located between the through-via and the sidewall of the semiconductor device.

In some embodiments, the ESD-protection layer is insulated from the at least one redistribution line.

In some embodiments, the ESD-protection layer is sandwiched between the first molding compound and the first dielectric layer.

In some embodiments, the semiconductor device and part of the at least one redistribution line are surrounded by the ESD-protection layer.

In some embodiments, a top view of the ESD-protection layer is substantially rectangular.

In some embodiments, at least one side of the rectangular ESD-protection layer is wavy.

In some embodiments, the ESD-protection layer is formed over and spaced apart from the at least one redistribution line.

In some embodiments, the ESD-protection layer is located between the through-via and the sidewall of the semiconductor device.

In some embodiments, the ESD-protection layer is insulated from the at least one redistribution line.

In some embodiments, the ESD-protection layer is formed in the first dielectric layer or over the first dielectric layer.

In some embodiments, the semiconductor device and part of the at least one redistribution line are surrounded by the ESD-protection layer.

In some embodiments, a top view of the ESD-protection layer is substantially rectangular.

In some embodiments, at least one side of the rectangular ESD-protection layer is wavy.

In some embodiments, the at least one redistribution line comprises the MIM feature, wherein the MIM feature is a capacitor structure.

In some embodiments, the at least one redistribution line has a first section and a second section, wherein the first section is electrically connected to the semiconductor device and the second section is electrically connected to the through-via, and the capacitor structure is connected with the first section and the second section.

In some embodiments, the capacitor structure is a horizontal arrangement.

In some embodiments, a height of the first section of the at least one redistribution line is the same as a height of the second section of the at least one redistribution line.

In some embodiments, the capacitor structure is a vertical arrangement.

In some embodiments, the first section of the at least one redistribution line is higher than the second section of the at least one redistribution line.

In some embodiments, the first section of the at least one redistribution line is lower than the second section of the at least one redistribution line.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 2 to 16 are cross-sectional views of a package structure at various stages in accordance with some embodiments of the present disclosure.

DETAILED DESCRIPTION

Figure 1:
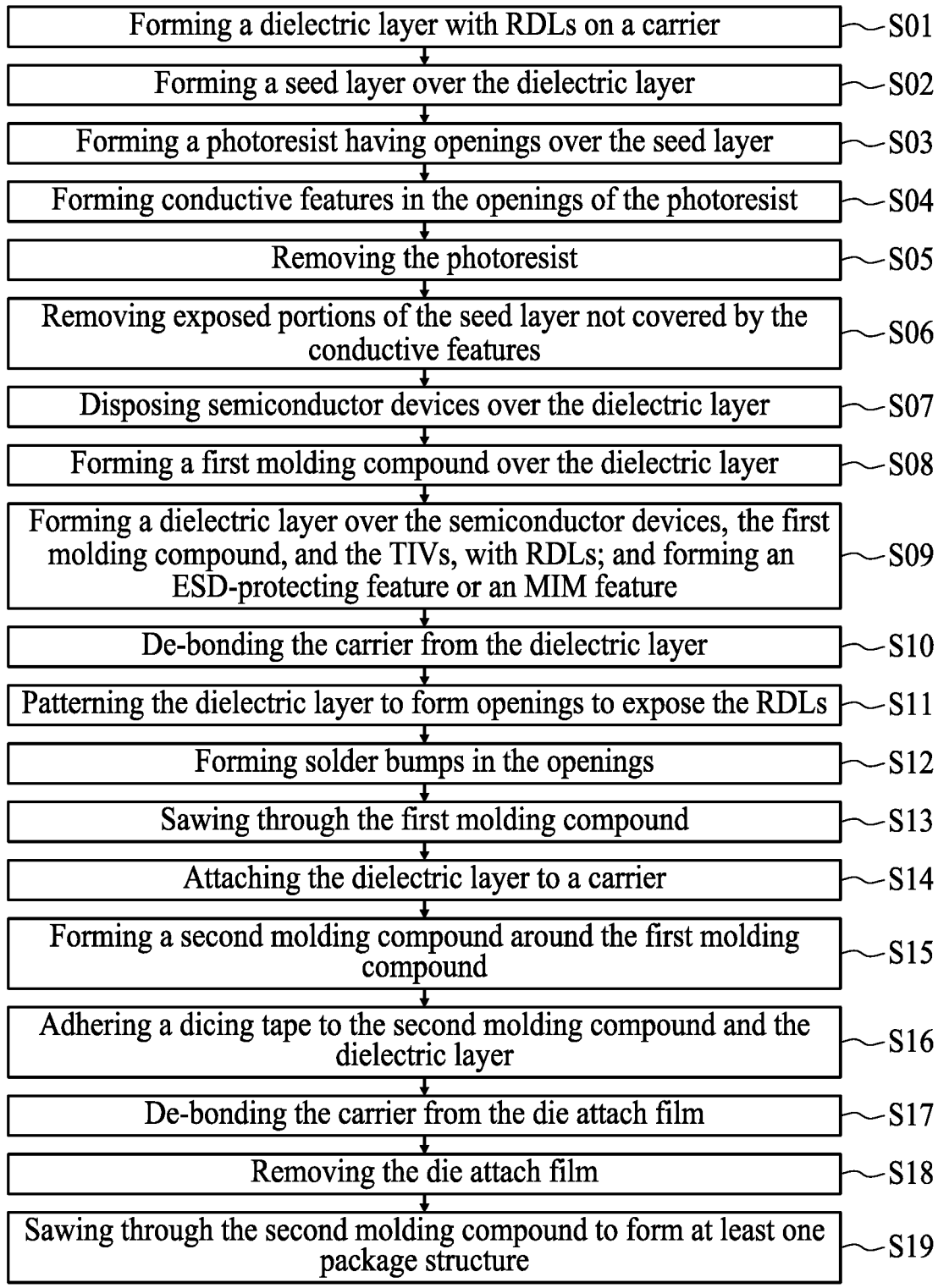
FIG. 1 is a flowchart illustrating a method of forming a package structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a flowchart illustrating a method of forming a package structure in accordance with some embodiments of the present disclosure. FIGS. 2 to 16 are cross-sectional views of the package structure at various stages in accordance with some embodiments of the present disclosure. The method begins at step S01 of FIG. 1, in which a dielectric layer 10 with RDLs (redistribution lines) 20 is formed on a carrier 110. Referring to FIG. 2, the dielectric layer 10 is formed on the carrier 110. The carrier 110 may be a blank glass carrier, a blank ceramic carrier, or the like, but is not limited thereto. The dielectric layer 10 may be a polymer layer. In some embodiments, the polymer layer may include polyimide, polybenzoxazole (PBO), benzocyclobutene (BCB), an ajinomoto buildup film (ABF), a solder resist film (SR), or the like, but is not limited thereto. Moreover, the RDLs 20 are formed in the dielectric layer 10, and portions of the RDLs 20 are exposed through the dielectric layer 10. In some embodiments, the formation of one layer of the RDLs 20 includes forming a blanket copper seed layer, forming and patterning a mask layer over the blanket copper seed layer, performing a plating to form the RDLs 20, removing the mask layer, and performing a flash etching to remove the portions of the blanket copper seed layer not covered by the RDLs 20. In alternative embodiments, the RDLs 20 are formed by depositing metal layers, patterning the metal layers, and filling gaps between the RDLs 20 with the dielectric layers 10. One layer of the RDLs 20 shown in FIG. 2 is for illustration, and various embodiments of the present disclosure are not limited in this regard. In alternative embodiments, the dielectric layer 10 with plural layers of the RDLs 20 is formed on the carrier 110.

The method continues with step S02 of FIG. 1. Referring to FIG. 3, a seed layer 32 is formed over the dielectric layer 10 and the exposed RDLs 20, for example, through PVD or metal foil laminating. The seed layer 32 may include copper, copper alloy, aluminum, titanium, titanium alloy, or combinations thereof. In some embodiments, the seed layer 32 includes a titanium layer and a copper layer over the titanium layer. In alternative embodiments, the seed layer 32 is a copper layer.

The method continues with step S03 of FIG. 1, in which a photoresist 130 having openings 132 is formed over the seed layer 32. Referring to FIG. 4, the photoresist 130 is applied over the seed layer 32 and is then patterned to expose some portions of the seed layer 32. As a result, the openings 132 are formed in the photoresist 130, wherein some portions of the seed layer 32 are exposed through the openings 132.

The method continues with step S04 of FIG. 1. Reference is made to FIG. 5. Conductive features 34 are respectively formed in the openings 132 of the photoresist 130 through, for example, plating, which may be electro plating, electroless plating, or metal-paste printing. The conductive features 34 are plated on the exposed portions of the seed layer 32 underlying the openings 132. The conductive features 34 may include copper, aluminum, tungsten, nickel, solder, silver or alloys thereof. Top-view shapes of the conductive features 34 may be rectangles, squares, circles, or other shapes. Heights of the conductive features 34 are determined by the thickness of the subsequently placed semiconductor devices 40 (see FIG. 8).

Figure 6:
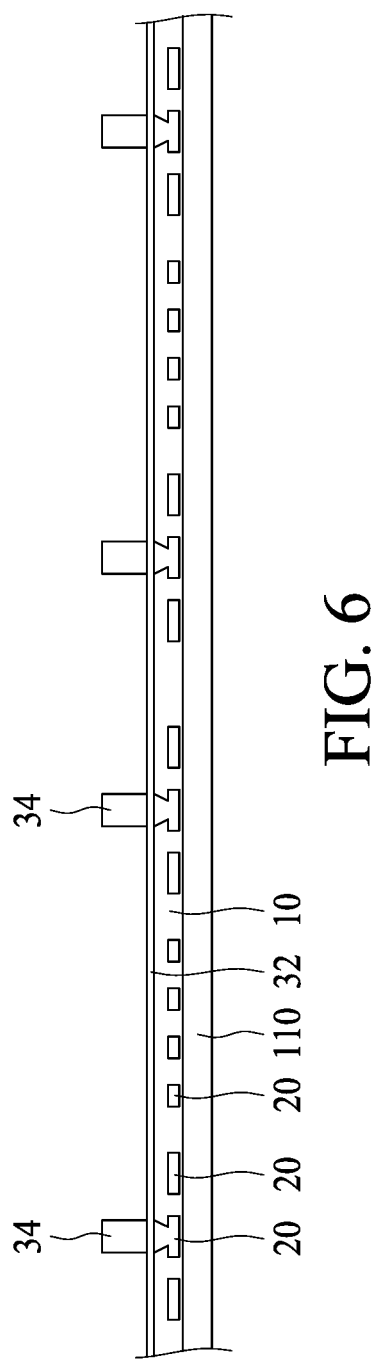

The method continues with step S05 of FIG. 1. After the plating of the conductive features 34, the photoresist 130 is removed, and the resulting structure is shown in FIG. 6. After the photoresist 130 is removed, some portions of the seed layer 32 are exposed.

Figure 7:
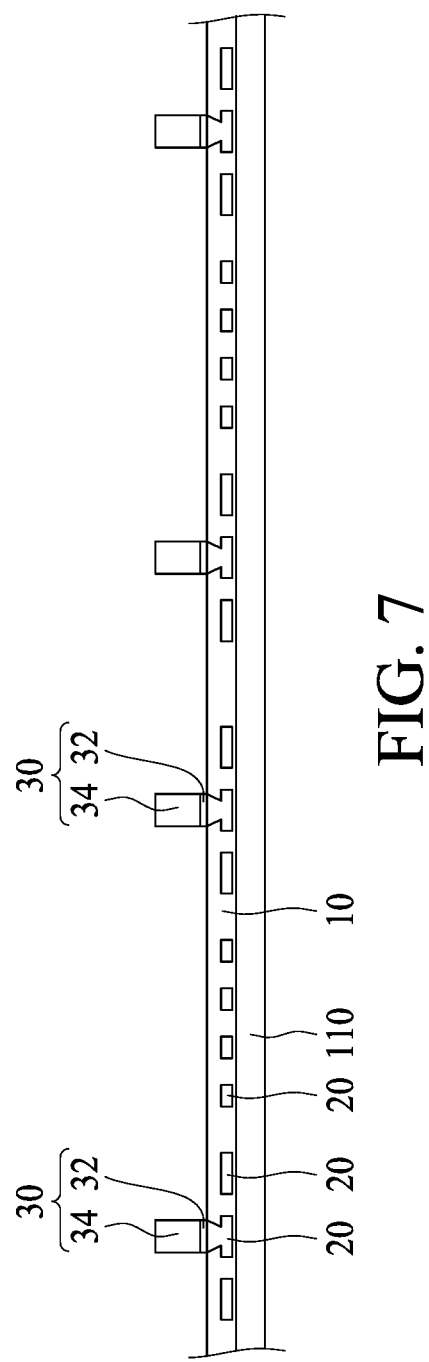

The method continues with step S06 of FIG. 1. Reference is made to FIG. 7. An etch step is performed to remove the exposed portions of the seed layer 32 that are not covered by the conductive features 34, wherein the etch step may include an anisotropic etching. Some portions of the seed layer 32 that are covered by the conductive features 34, on the other hand, remain not etched. Throughout the description, the conductive features 34 and the remaining underlying portions of the seed layer 32 are in combination referred to as through integrated fan-out (InFO) vias (TIVs) 30, which are also referred to as through-vias. Although the seed layer 32 is shown as a layer separate from the conductive features 34, when the seed layer 32 is made of a material similar to or substantially the same as the respective overlying conductive features 34, the seed layer 32 may be merged with the conductive features 34 substantially free of any distinguishable interface therebetween. In alternative embodiments, there are distinguishable interfaces between the seed layer 32 and the overlying conductive features 34.

Figure 8:
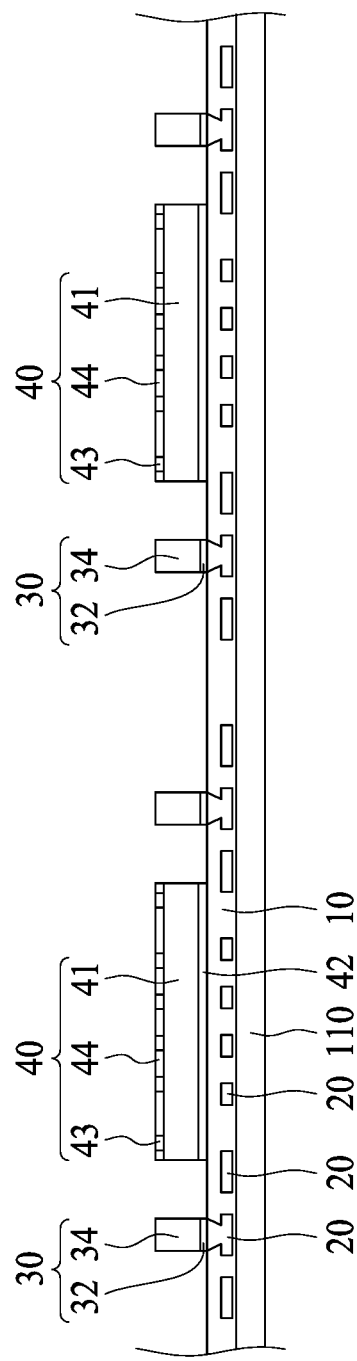

The method continues with step S07 of FIG. 1. FIG. 8 illustrates placement of the semiconductor devices 40 on the dielectric layer 10. The semiconductor devices 40 may be disposed on the dielectric layer 10 through adhesives 42. The semiconductor devices 40 may be logic semiconductor devices that include logic transistors. In some embodiments, the semiconductor devices 40 are designed for mobile applications, and may be central processing unit (CPU) dies, memory dies, sensor dies, or the like. In some embodiments, the semiconductor devices 40 includes a semiconductor substrate 41 (such as a silicon substrate) that contacts the adhesive 42, in which the back surface of the semiconductor device 40 (i.e., the lower surface) is in contact with the adhesive 42.

In some embodiments, conductive pads 43 (such as copper posts) are formed as the top portions of the semiconductor devices 40, and are electrically coupled to devices such as transistors (not shown) in the semiconductor devices 40. In some embodiments, a dielectric layer 44 is formed on the top surface of the respective semiconductor device 40, with the conductive pads 43 having at least lower portions in the dielectric layer 44. In some embodiments, top surfaces of the conductive pads 43 may be substantially level with top surfaces of the dielectric layers 44. Alternatively, the dielectric layers 44 are not formed, and the conductive pads 43 protrude from the respective semiconductor device 40 (such arrangement is not shown).

Figure 9:
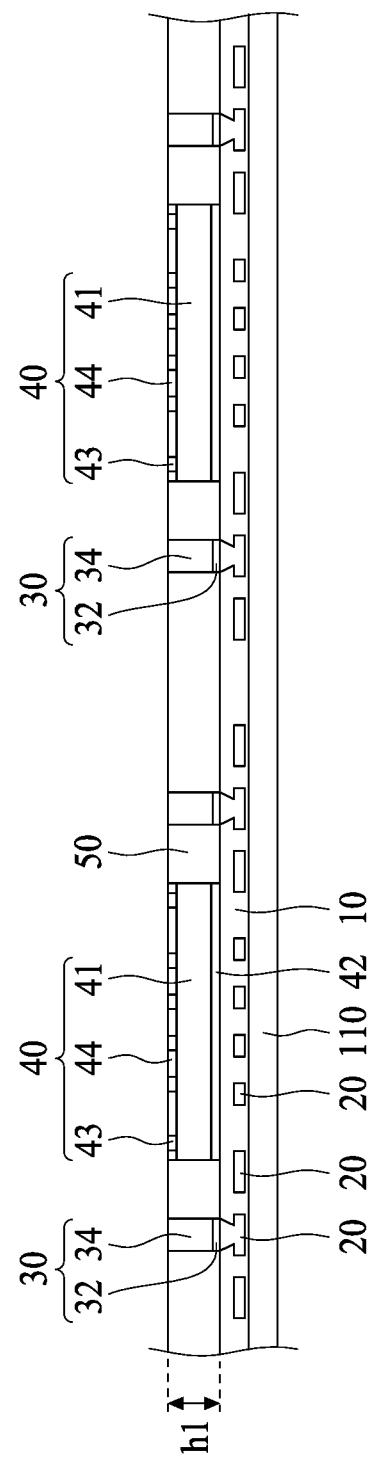

The method continues with step S08 of FIG. 1. Referring to FIG. 9, a first molding compound 50 is formed on the dielectric layer 10 to be in contact with the semiconductor devices 40 and the TIVs 30. The first molding compound 50 is molded around the semiconductor devices 40 and the TIVs 30. The first molding compound 50 fills gaps between the semiconductor devices 40 and the TIVs 30, and may be in contact with the dielectric layer 10. In some embodiments, the first molding compound 50 includes a polymer-based material. The term "polymer" can refer to thermosetting polymers, thermoplastic polymers, or combinations thereof. In some embodiments, the polymer-based material can include plastic materials, epoxy resin, polyimide, polyethylene terephthalate (PET), polyvinyl chloride (PVC), polymethylmethacrylate (PMMA), polymer components doped with fillers including fiber, clay, ceramic or inorganic particles, or combinations thereof, but the material is not limited thereto.

In some embodiments, the molding is an expose molding, wherein top surfaces of the semiconductor devices 40 and the TIVs 30 are exposed through the first molding compound 50. Furthermore, the molding may be performed using transfer molding. In some embodiments, the molding is performed using a mold (not shown) to cover the top surfaces of the semiconductor devices 40 and the TIVs 30, so that the resulting first molding compound 50 will not cover the top surfaces of the semiconductor devices 40 and the TIVs 30. During the transfer molding, a vacuum is applied to the inner space of the mold, and molding material is injected into the inner space of the mold to form the first molding compound 50.

The resulting structure is shown in FIG. 9, in which the first molding compound 50 is in contact with sidewalls of the semiconductor devices 40 and the TIVs 30. Due to the expose molding, the top surfaces of the TIVs 30 and the conductive pads 43 are substantially level (coplanar) with the top surface of the first molding compound 50. As a result, the thickness h1 of the first molding compound 50 and the thickness of the TIVs 30 are substantially the same. That is, the TIVs 30 extend through the first molding compound 50.

Figure 10:
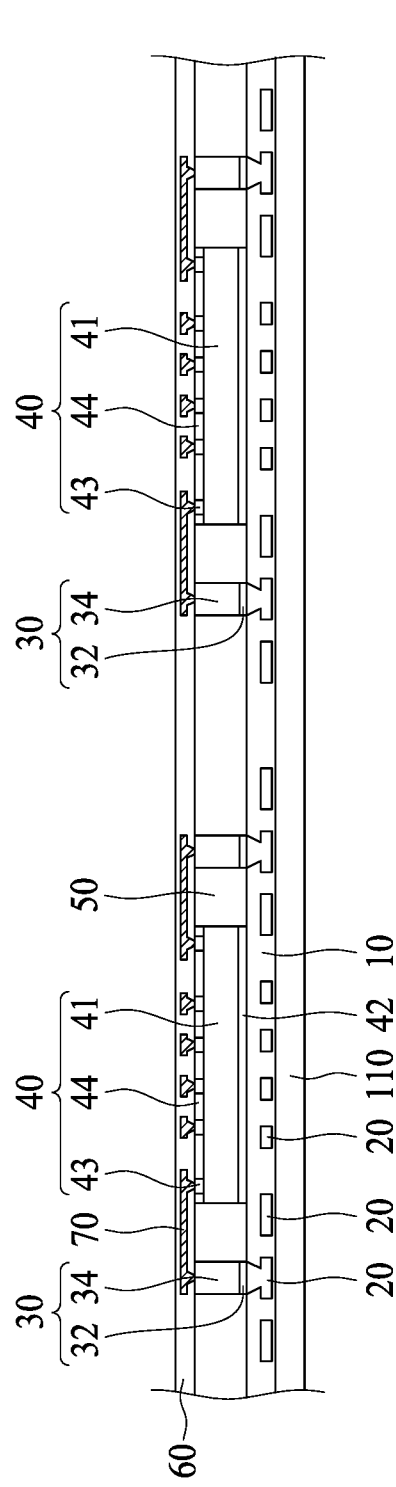

The method continues with step S09, in which a dielectric layer 60 is formed over the semiconductor devices 40, the first molding compound 50, and the TIVs 30, wherein the dielectric layer 60 includes RDLs 70 disposed therein. Referring to FIG. 10, the dielectric layer 60 is formed over the first molding compound 50, the semiconductor devices 40, and the TIVs 30, such that the first molding compound 50, the semiconductor devices 40, and the TIVs 30 are between the dielectric layer 10 and the dielectric layer 60. Moreover, the RDLs 70 are formed within the dielectric layer 60 and over the first molding compound 50, such that the RDLs 70 are electrically connected to the semiconductor devices 40 and the TIVs 30. In other words, the dielectric layer 60 is formed over the semiconductor devices 40, the first molding compound 50, and the TIVs 30, wherein the RDLs 70 are disposed within the dielectric layer 60. In some embodiments, the formation of one layer of the RDLs 70 includes forming a blanket copper seed layer, forming and patterning a mask layer over the blanket copper seed layer, performing a plating to form the RDLs 70, removing the mask layer, and performing a flash etching to remove the portions of the blanket copper seed layer not covered by the RDLs 70. In alternative embodiments, the RDLs 70 are formed by depositing metal layers, patterning the metal layers, and filling gaps between the RDLs 70 with the dielectric layers 60.

The RDLs 70 may include a metal or a metal alloy including aluminum, copper, tungsten, and/or alloys thereof. The dielectric layer 60 in such embodiments may include a polymer such as polyimide, benzocyclobutene (BCB), polybenzoxazole (PBO), or the like. Alternatively, the dielectric layer 60 may include inorganic dielectric materials such as silicon oxide, silicon nitride, silicon carbide, silicon oxynitride, or the like.

Figure 11:
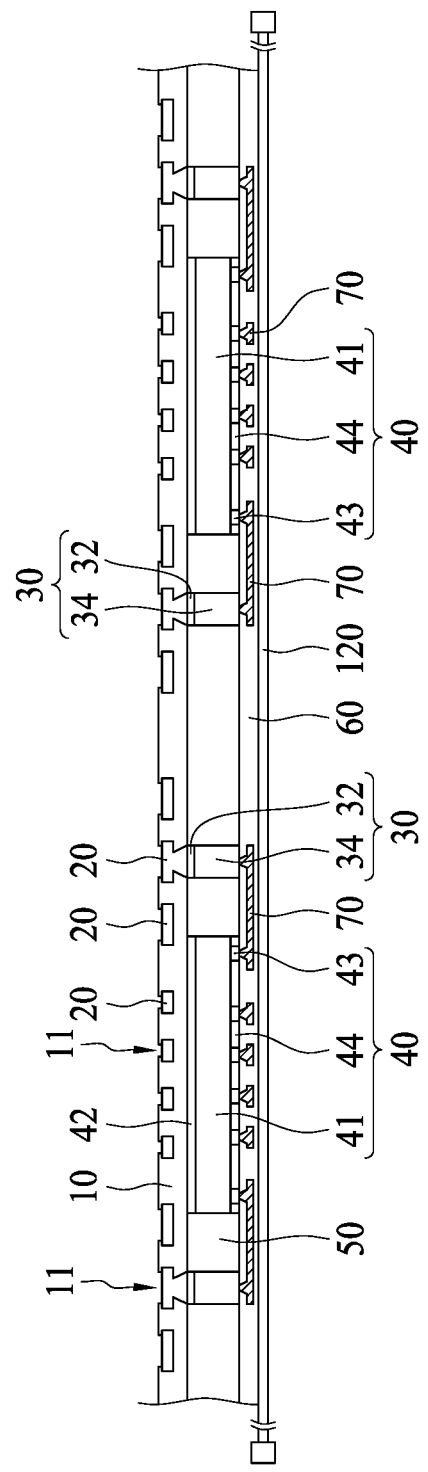

The method continues with step S10 of FIG. 1. Referring to FIG. 11, after the dielectric layer 60 and the RDLs 70 are formed over the TIVs 30, the semiconductor devices 40, and the first molding compound 50, a dicing tape 120 is adhered to the dielectric layer 60. Next, the structure of FIG. 10 with the dicing tape 120 may be flipped over, and then the carrier 110 is de-bonded from the dielectric layer 10.

The method continues with step S11 of FIG. 1. After the carrier 110 is de-bonded from the dielectric layer 10, the dielectric layer 10 is patterned to form openings 11 to at least partially expose the RDLs 20, and the resulting structure is shown in FIG. 11. In some embodiments, the openings 11 may be formed in the dielectric layer 10 by laser drill, although photolithography processes may also be used.

The method continues with step S12 of FIG. 1, in which solder bumps 80 and 80A are formed in the openings 11. Referring to FIG. 12, the solder bumps 80 and 80A are formed on the exposed portions of the RDLs 20. The solder bumps 80 and 80A may be formed by a solder paste printing process that is applied to the exposed RDLs 20. According to the locations of the exposed RDLs 20, a stencil may be employed to print the solder paste on top of the RDLs 20. A reflow process is applied so that the solder paste may coalesce into the solder bumps 80 and 80A on top of the RDLs 20. In some embodiments, the size of the solder bumps 80 is different from that of the solder bumps 80A. In some embodiments, the solder bumps 80A are smaller than the solder bumps 80.

The method continues with step S13 of FIG. 1, in which the first molding compound 50 is sawed through. Referring to FIG. 12, after the solder bumps 80 and 80A are formed, a singulation process is carried out to saw through the dielectric layer 10, the first molding compound 50, and the dielectric layer 60 along lines L1, such that a plurality of chip-scale packages 55 on the dicing tape 120 may be formed.

The method continues with step S14 of FIG. 1, in which the dielectric layer 10 is attached to a carrier 110A. Referring to FIG. 13, after the sawing step, the chip-scale packages 55 are picked from the dicing tape 120, and then the picked packages 55 are placed on a die attach film (DAF) 140 over the carrier 110A. Therefore, the die attach film 140 on the carrier 110A can cover the solder bumps 80 and 80A and the dielectric layer 10 for protection. In other words, the solder bumps 80 and 80A are embedded in the die attach film 140. The number of the picked packages 55 shown in FIG. 13 is for illustration purpose, and various embodiments of the present disclosure are not limited in this regard. In some embodiments, the carrier 110A may be the same as the carrier 110 shown in FIGS. 2 to 10. In alternative embodiments, the carrier 110A is different from the carrier 110, and various embodiments of the present disclosure are not limited in this regard. In some embodiments, the carrier 110A may be a blank glass carrier, a blank ceramic carrier, or the like.

The method continues with step S15 of FIG. 1, in which a second molding compound 90 is formed around the first molding compound 50. Referring to FIG. 13, after the packages 55 are placed on the die attach film 140, the second molding compound 90 is molded around the packages 55. The dielectric layer 10, the dielectric layer 60, and the first molding compound 50 are surrounded by the second molding compound 90. The bottom surface of the dielectric layer 10 is substantially coplanar with the bottom surface of the second molding compound 90, and the top surface of the dielectric layer 60 is substantially coplanar with the top surface of the second molding compound 90. The second molding compound 90 may be a polymer, a resin, or the like. The second molding compound 90 and the first molding compound 50 may be made of the same material or of different materials, and various embodiments of the present disclosure are not limited in this regard. In some embodiments, the second molding compound 90 comprises a molding underfill, which acts as a molding compound and an underfill. Accordingly, the second molding compound 90 is filled into the gap between two neighboring packages 55, and may be in contact with, and may surround, the packages 55.

In some embodiments, the molding is an expose molding, wherein the top surfaces of the packages 55 are exposed through the second molding compound 90. Furthermore, the molding may be performed using transfer molding. In some embodiments, the molding is performed using a mold (not shown) to cover the top surfaces of the packages 55, so that the resulting second molding compound 90 does not cover the top surfaces of packages 55. During the transfer molding, a vacuum is applied to the inner space of the mold, and molding material is injected into the inner space of the mold to form the second molding compound 90.

Due to the expose molding, the top surface of the second molding compound 90 may be substantially level with the top surfaces of the packages 55. In some embodiments, the top surface of the second molding compound 90 is substantially coplanar with the top surfaces of the packages 55. In alternative embodiments, the top surface of the second molding compound 90 is slightly lower than the top surfaces of the packages 55, and various embodiments of the present disclosure are not limited in this regard.

The second molding compound 90 is formed around the dielectric layer 60, the first molding compound 50, and the dielectric layer 10. Moreover, the thickness h2 of the second molding compound 90 is substantially the same as the total thickness h3 of the first molding compound 50, the dielectric layer 10, and the dielectric layer 60 of the respective package 55.

Since the second molding compound 90 forms the packages by a molding process, the ratio of the area of each of the packages 55 to the area of the corresponding semiconductor device 40 can be reduced. As a result, during the manufacturing process of the packages 55 (e.g., the manufacturing process shown in FIGS. 2 to 12), the warpage of the packages 55 can be prevented due to the decrease of the amount of the first molding compound 50, thereby improving the process yield and the reliability yield of the packages 55.

Figure 14:
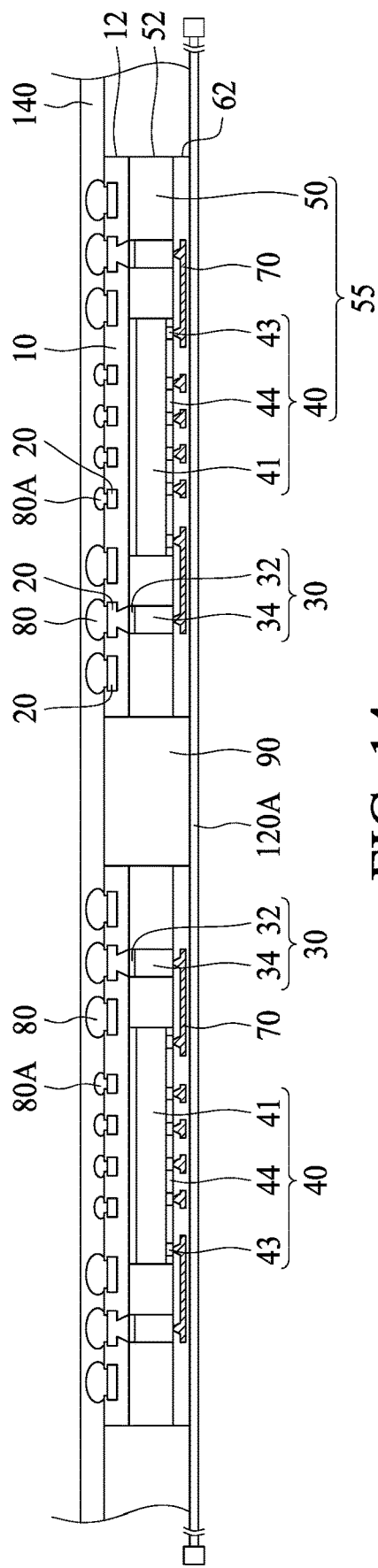

The method continues with steps S16 and S17 of FIG. 1. Referring to FIG. 14, after the formation of the second molding compound 90, a dicing tape 120A is adhered to the second molding compound 90 and the dielectric layer 60. Next, the structure of FIG. 13 with the dicing tape 120A may be flipped over, and the carrier 110A is then de-bonded from the die attach film 140. The resulting structure is shown in FIG. 14. In some embodiments, the dicing tape 120A may be the same as the dicing tape 120 shown in FIGS. 11 and 12. In alternative embodiments, the dicing tape 120A is different from the dicing tape 120, and various embodiments of the present disclosure are not limited in this regard.

Figure 15:
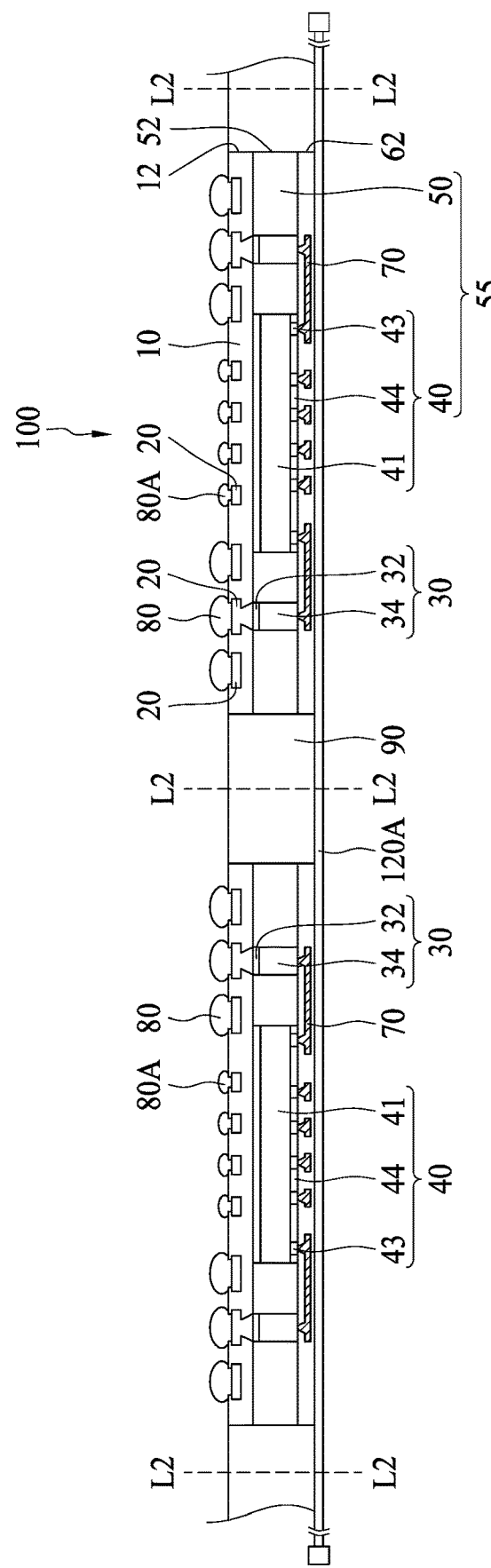

The method continues with step S18 of FIG. 1, in which the die attach film 140 is removed. Referring to FIG. 15, after the carrier 110A is removed, the die attach film 140 is cleaned from the packages 55, such that the solder bumps 80 and 80A and the dielectric layer 10 are exposed.

Figure 16:
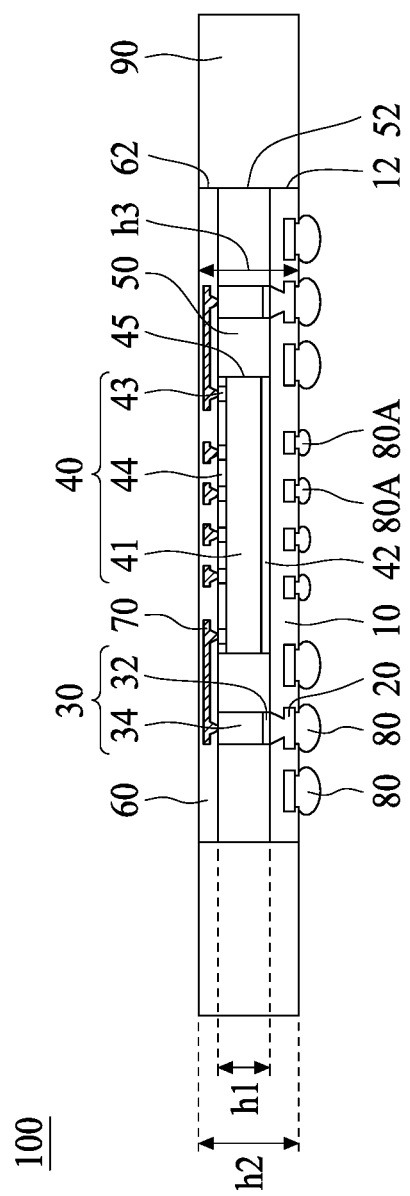
Figure 17:
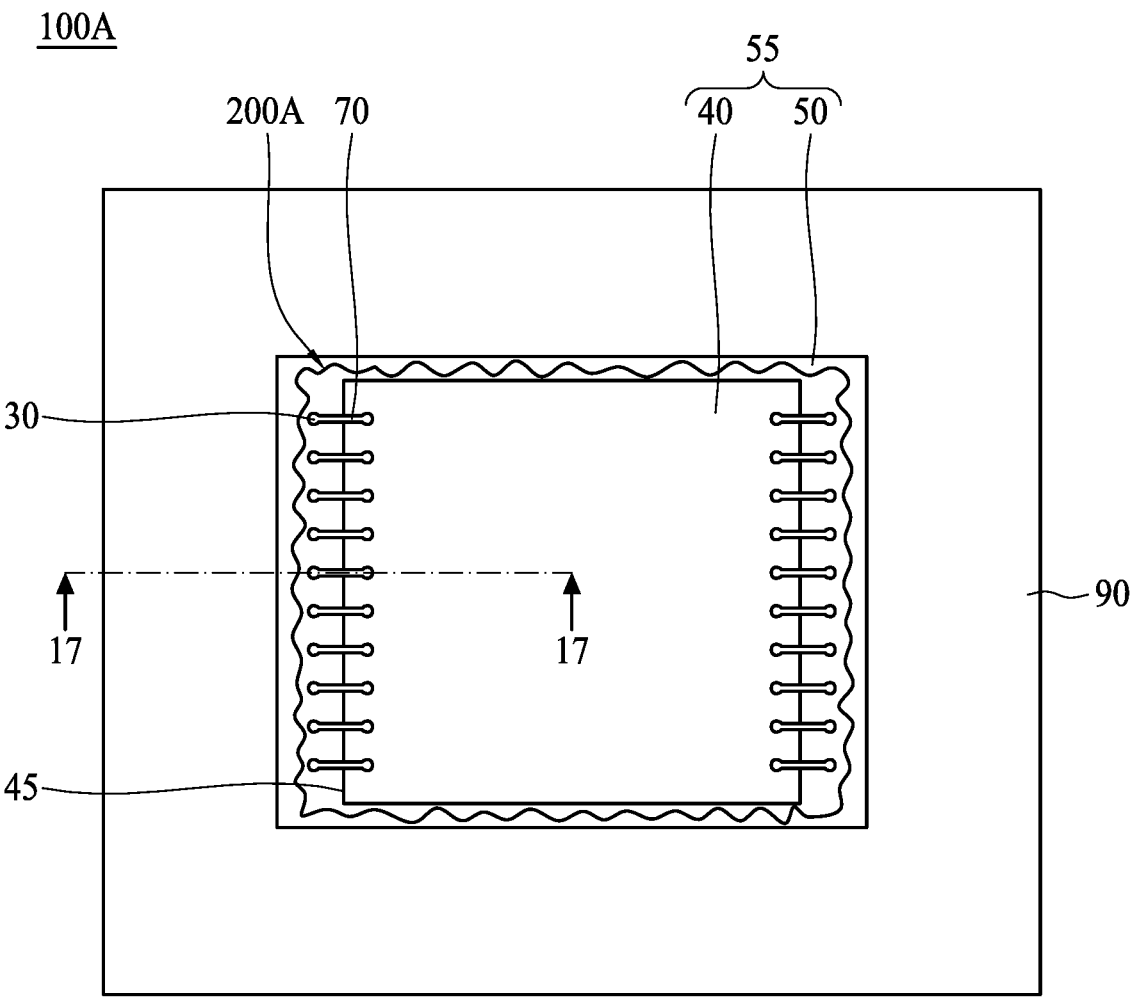
FIG. 17 is a top view of a package structure with an ESD-protection feature in accordance with the present disclosure.

The method continues with step S19, in which the second molding compound 90 is sawed through to form at least one package structure 100. Referring to FIG. 15, a sawing step is carried out to saw through the structure of FIG. 15 along lines L2. As a result, the second molding compound 90 with embedded packages 55 is sawed through to form a plurality of individual packages, wherein each of the packages has the semiconductor device 40, the first molding compound 50, and the second molding compound 90. In other words, after the sawing step, at least one package structure 100 is picked from the dicing tape 120A, such that the package structure 100 as shown in FIGS. 16 and 17 can be obtained. In the sawing step, the size of the package structure 100 may be determined by the sawing positions of the second molding compound 90, and hence a desired size of the package structure 100 can be achieved.

FIG. 16 is a cross-sectional view of the package structure 100. Since the thickness h2 of the second molding compound 90 is substantially the same as the total thickness h3 of the first molding compound 50, the dielectric layer 10, and the dielectric layer 60, the thickness h1 of the first molding compound 50 is smaller than the thickness h2 of the second molding compound 90. Moreover, the first molding compound 50 is in contact with a sidewall 45 of the semiconductor device 40. The second molding compound 90 is in contact with a sidewall 12 of the dielectric layer 10, a sidewall 52 of the first molding compound 50, and a sidewall 62 of the dielectric layer 60. Stated differently, the dielectric layer 10 and the second molding compound 90 have an interface, the first molding compound 50 and the second molding compound 90 have an interface, and the dielectric layer 60 and the second molding compound 90 have an interface.

Figure 18:
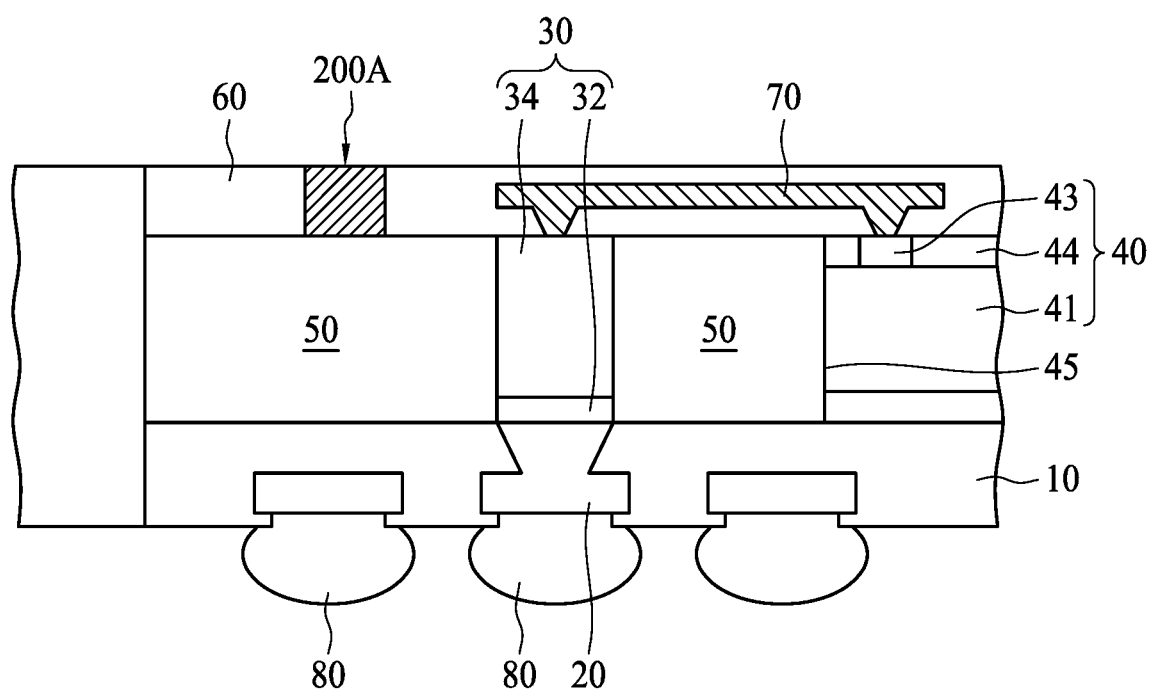
FIG. 18 is a close-up cross-sectional view along a cross-sectional line 17-17 in FIG. 17 in accordance with the present disclosure.

FIG. 17 is a top view of a package structure 100A with an ESD-protection feature in accordance with the present disclosure, and FIG. 18 is a close-up cross-sectional view along a cross-sectional line 17-17 in FIG. 17 in accordance with the present disclosure. In some embodiments, the ESD-protection feature is formed in step S09. That is, the ESD-protection feature and the RDLs 70 are integrally formed. In some embodiments, the ESD-protection feature is an ESD-protection layer 200A formed in the dielectric layer 60 by the fabrication processes similar to the RDLs. In some embodiments, the ESD-protection layer 200A is electrically insulated from the RDLs (redistribution lines) 70 by the dielectric layer 60.

In some embodiments, the semiconductor device 40 is surrounded by the first molding compound 50, and the first molding compound 50 is surrounded by the second molding compound 90. In other words, the first molding compound 50 is located between the semiconductor device 40 and the second molding compound 90, and thus the second molding compound 90 is free of the conductive features 34. Because the second molding compound 90 is formed after the formation of the package 55, the second molding compound 90 can expand the package structure 100A to a desired size.

Furthermore, in FIG. 17, the RDLs 70, the TIVs (through-vias) and the semiconductor device 40 are surrounded by the ESD-protection layer 200A. In some embodiments, a top view of the ESD-protection layer 200A is substantially rectangular. In some embodiments, at least one side of the rectangular ESD-protection layer is wavy. Therefore, the ESD-protection layer 200A may protect the semiconductor device 40 from damage caused by ESD.

Figure 19:
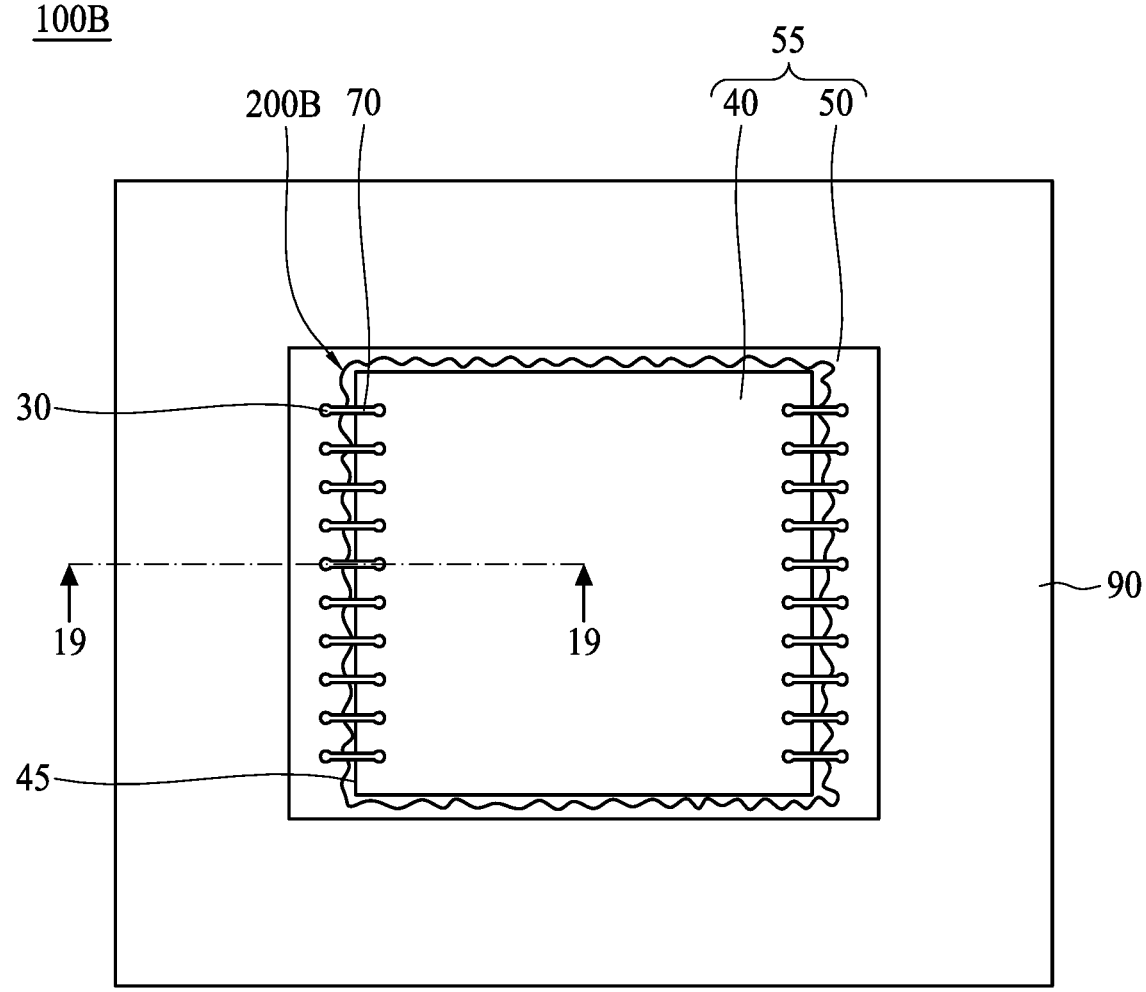
FIG. 19 is a top view of a package structure with an ESD-protection feature in accordance with the present disclosure.
Figure 20:
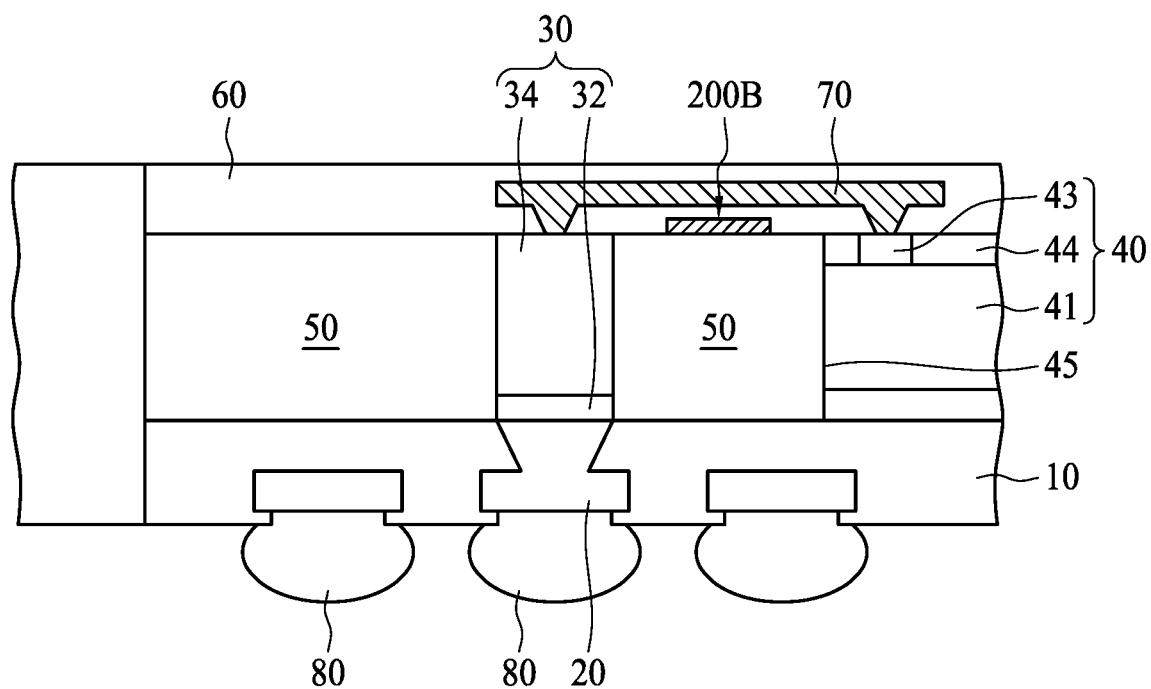
FIG. 20 to FIG. 22 are close-up cross-sectional views along a cross-sectional line 19-19 in FIG. 19 in accordance with the present disclosure.
Figure 21:
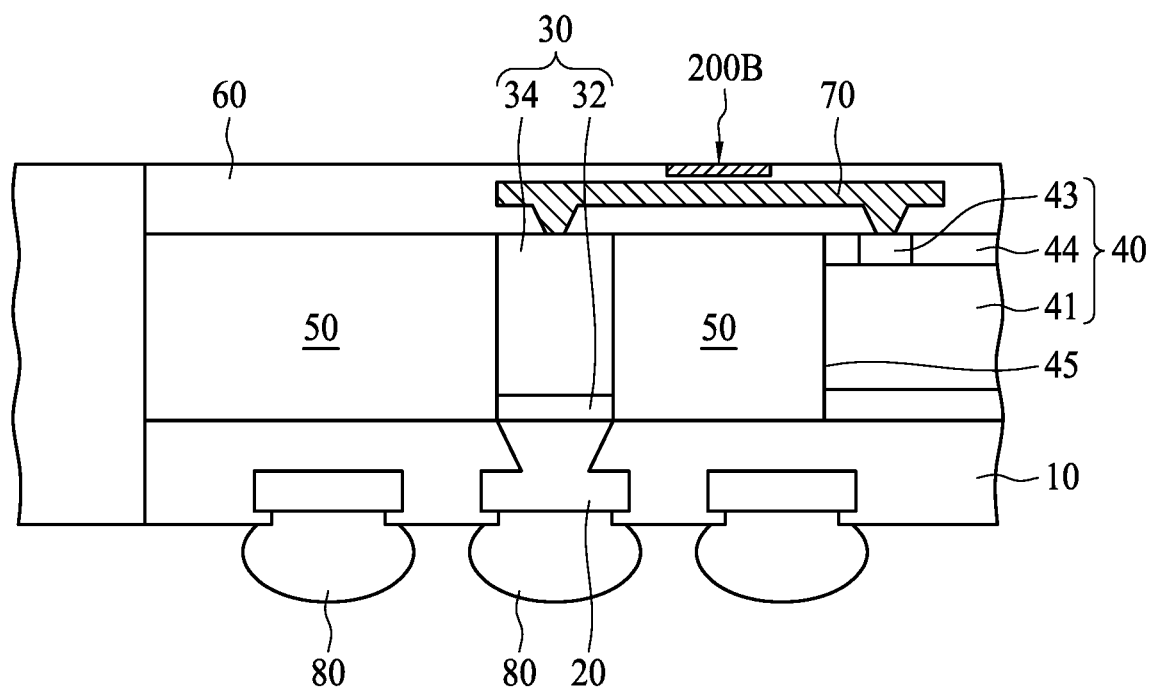
Figure 22:
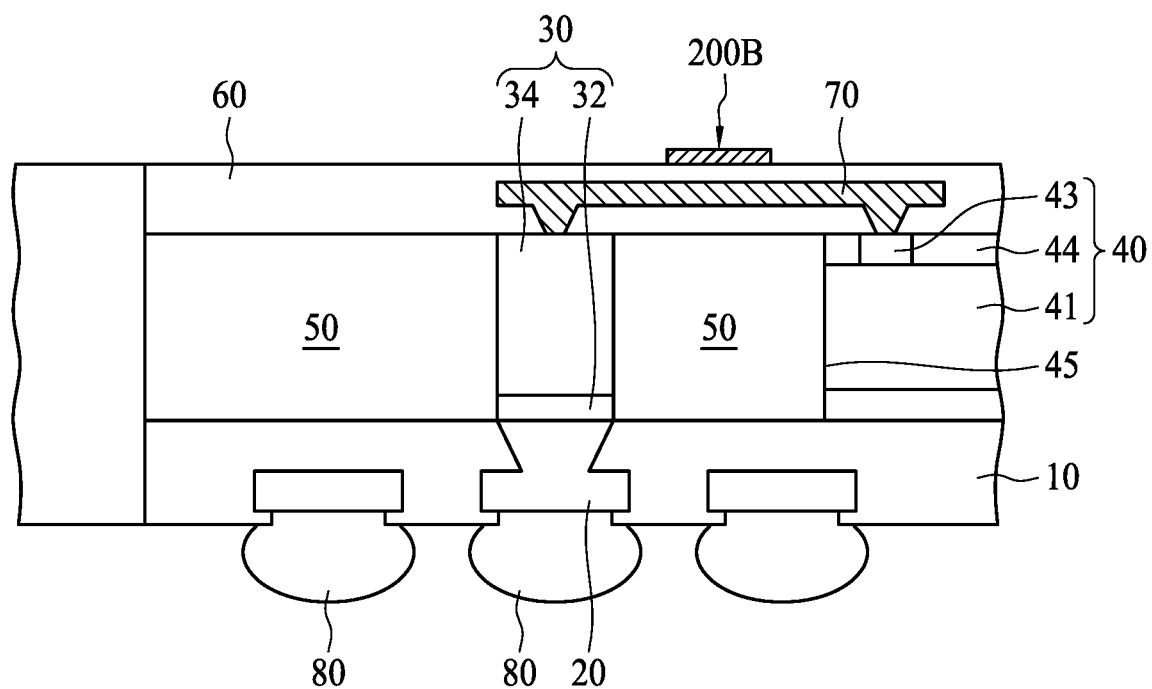

FIG. 19 is a top view of a package structure 100B with an ESD-protection feature in accordance with the present disclosure, and FIG. 20 to FIG. 22 are close-up cross-sectional views along a cross-sectional line 19-19 in FIG. 19 in accordance with the present disclosure. In some embodiments, the ESD-protection feature is formed in step S09. That is, the ESD-protection feature and the RDLs 70 are integrally formed.

In some embodiments, the ESD-protection feature is an ESD-protection layer 200B. In some embodiments, the ESD-protection layer 200B is formed under and spaced apart from the RDLs 70. In some embodiments, the ESD-protection layer 200B is located horizontally between the TSVs (through-vias) 30 and the sidewall 45 of the semiconductor device 40. In some embodiments, the ESD-protection layer 200B is electrically insulated from the RDLs 70. In some embodiments, the ESD-protection layer 200B is sandwiched vertically between the first molding compound 50 and the dielectric layer 60, as shown in FIG. 20. In some embodiments, the ESD-protection layer 200B is vertically disposed in the dielectric layer 60 (as shown in FIG. 21) or over the dielectric layer 60 (as shown in FIG. 22)

In some embodiments, the semiconductor device 40 is surrounded by the first molding compound 50, and the first molding compound 50 is surrounded by the second molding compound 90. In other words, the first molding compound 50 is located between the semiconductor device 40 and the second molding compound 90, and thus the second molding compound 90 is free of the conductive features 34. Because the second molding compound 90 is formed after the formation of the package 55, the second molding compound 90 can expand the package structure 100B to a desired size.

Furthermore, In some embodiments, the semiconductor device 40 and part of the RDLs 70 are surrounded by the ESD-protection layer 200B. In some embodiments, a top view of the ESD-protection layer 200 is substantially rectangular. In some embodiments, at least one side of the rectangular ESD-protection layer 200B is wavy. Therefore, the ESD-protection layer 200 may protect the semiconductor device 40 from damage caused by ESD.

Figure 23:
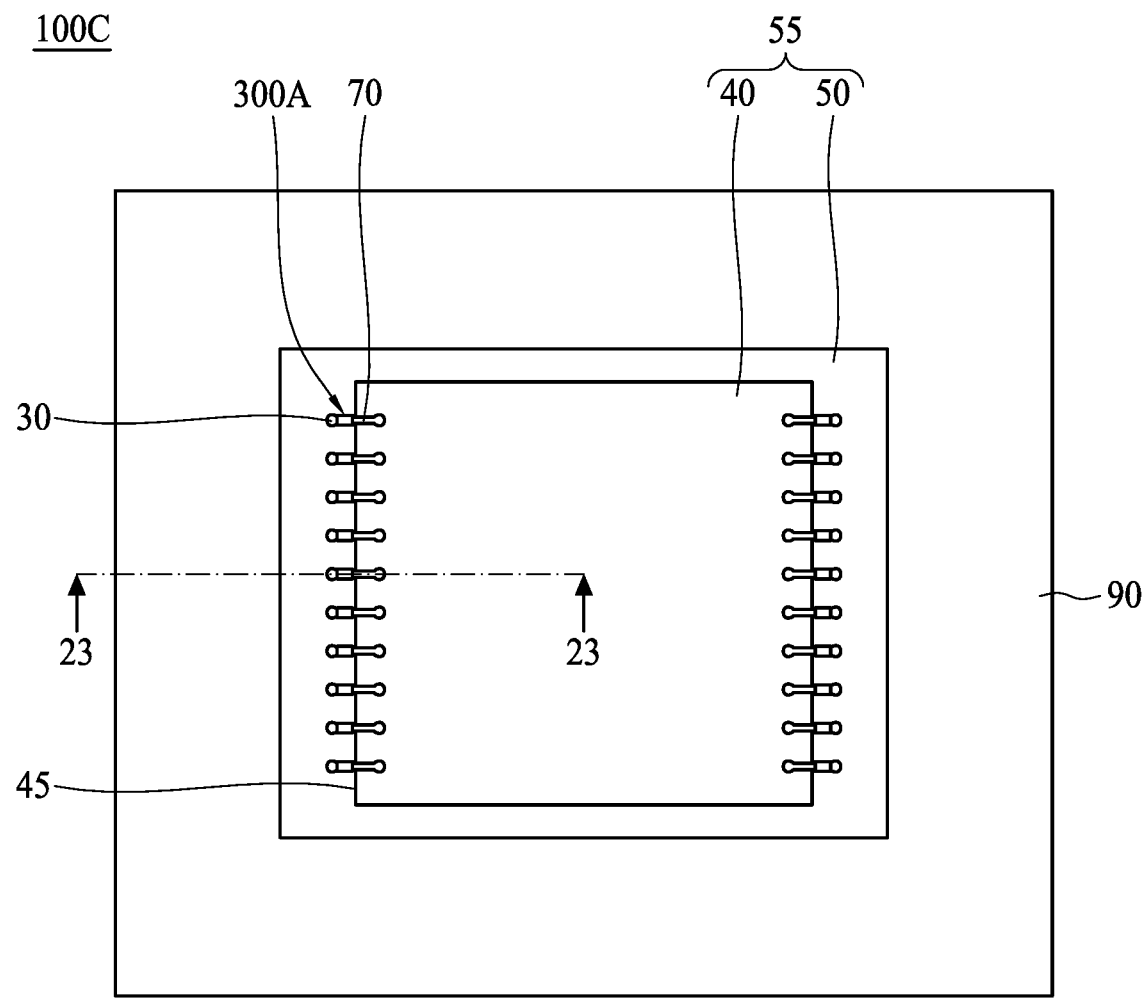
FIG. 23 is a top view of a package structure with a MIM (metal-insulator-metal) in accordance with the present disclosure.
Figure 24:
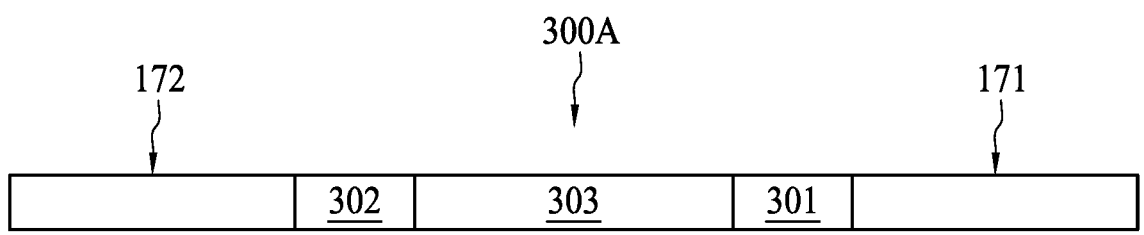
FIG. 24 is a close-up cross-sectional view along a cross-sectional line 23-23 in FIG. 23 in accordance with the present disclosure.

FIG. 23 is a top view of a package structure 100C with a MIM (metal-insulator-metal) in accordance with the present disclosure, and FIG. 24 is a close-up cross-sectional view along a cross-sectional line 23-23 in FIG. 23 in accordance with the present disclosure. In some embodiments, the MIM feature is formed in step S09. That is, the MIM feature and the RDLs 70 are integrally formed.

In some embodiments, the MIM feature is a capacitor structure 300A. In some embodiments, the RDLs 70 has a first section 171 and a second section 172. In some embodiments, the first section 171 is electrically connected to the semiconductor device 40 and the second section 172 is electrically connected to the TIVs (through-vias) 30. In some embodiments, the capacitor structure 300A includes a first electrode 301, a second electrode 302, and a dielectric part 303 between the first electrode 301 and the second electrode 302, wherein the first electrode 301 is electrically connected to the first section 171 and the second electrode 302 is electrically connected to the second section 172. In some embodiments, the capacitor structure 300A is arranged horizontally. In some embodiments, a height of the first section 171 of each of the RDLs 70 is the same as a height of the second section 172 of each of the RDLs 70.

Figure 25:
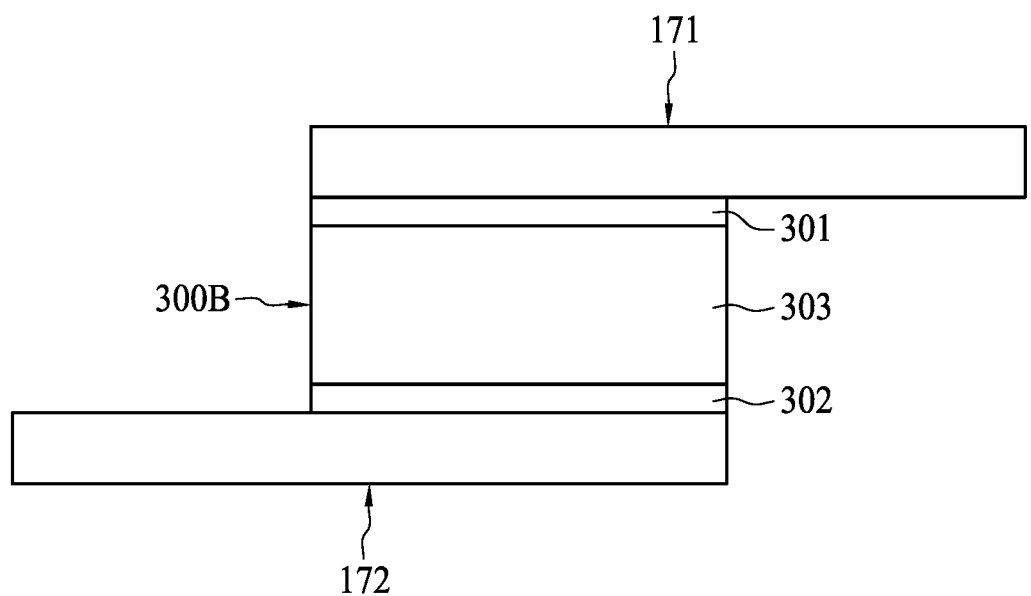
FIG. 25 is a close-up cross-sectional view of a vertically arranged capacitor structure in accordance with the present disclosure

FIG. 25 is a close-up cross-sectional view of a vertically arranged capacitor structure 300B in accordance with the present disclosure. In some embodiments, the first section 171 of each of the RDLs 70 is higher than the second section 172 of each of the RDLs 70.

Figure 26:
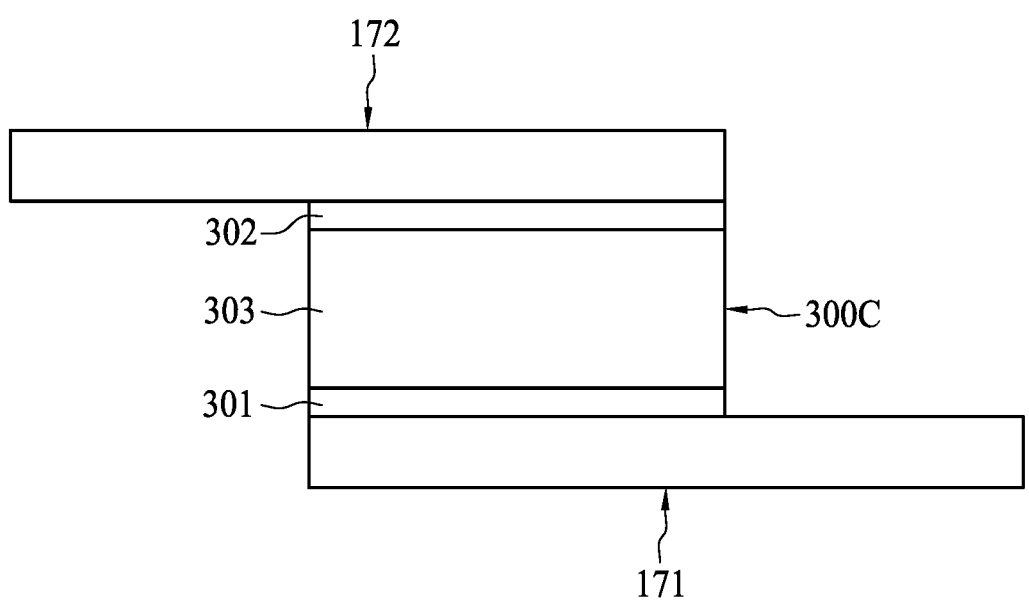
FIG. 26 is a close-up cross-sectional view of a vertically arranged capacitor structure in accordance with the present disclosure.

FIG. 26 is a close-up cross-sectional view of a vertically arranged capacitor structure 300C in accordance with the present disclosure. In some embodiments, the first section 171 of each of the RDLs 70 is lower than the second section 172 of each of the RDLs 70.

One aspect of the present disclosure provides a package structure 100. The package structure 100 may comprise a semiconductor device 40, a first molding compound 50, a through-via (TIV) 30, first and second dielectric layers 60, 10, and a second molding compound 90 in contact with a sidewall of the first dielectric layer 60. The first molding compound 50 is in contact with a sidewall of the semiconductor device 40. The TIV 30 is formed in the first molding compound 50 and electrically connected to the semiconductor device 40. The first and second dielectric layers 60, 10 are formed at upper and lower sides of the semiconductor device 40. The RDLs 70 are formed in the first dielectric layer 60 and electrically connected to the semiconductor device 40 and the TIV 30. The second molding compound 90 is in contact with a sidewall of the first dielectric layer 60. The RDLs 70 comprise an ESD-protection feature or a MIM (metal-insulator-metal) feature. The ESD-protection feature or the MIM feature may protect the semiconductor device 40 from damage caused by ESD.

In the aforementioned package structure, two molding steps are utilized to form the package structure. The final size of the package structure can be determined through different areas of the second molding compound disposed around the first molding compound. In other words, the package structure may fulfill diversified product size by utilizing the second molding compound. In addition, there are no RDLs or dielectric layers on or in the second molding compound. Therefore, the cost of manufacturing the package structure can be decreased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A package structure, comprising:
a semiconductor device;
a first molding compound in contact with a sidewall of the semiconductor device;
a through-via in the first molding compound, wherein the through-via is electrically connected to the semiconductor device;
first and second dielectric layers at upper and lower sides of the semiconductor device;
at least one redistribution line in the first and second dielectric layers, wherein the at least one redistribution line is electrically connected to the semiconductor device and the through-via; and
a second molding compound in contact with a sidewall of the first dielectric layer;
wherein the at least one redistribution line comprises an ESD-protection feature surrounding the semiconductor device;
wherein at least one side of the rectangular ESD-protection feature is wavy.

2. The package structure of claim 1, wherein the ESD-protection feature is an ESD-protection layer.

3. The package structure of claim 2, wherein the ESD-protection layer is formed in the first dielectric layer, and the ESD-protection layer is insulated from the at least one redistribution line.

4. The package structure of claim 2, wherein the at least one redistribution line and the through-via are surrounded by the ESD-protection layer.

5. The package structure of claim 1, wherein a top view of the ESD-protection feature is substantially rectangular.

6. The package structure of claim 2, wherein the ESD-protection layer is formed under and spaced apart from the at least one redistribution line.

7. The package structure of claim 6, wherein the ESD-protection layer is located between the through-via and the sidewall of the semiconductor device.

8. The package structure of claim 7, wherein the ESD-protection layer is sandwiched between the first molding compound and the first dielectric layer.

9. The package structure of claim 7, wherein a part of the at least one redistribution line is surrounded by the ESD-protection layer.

10. The package structure of claim 2, wherein the ESD-protection layer is formed over and spaced apart from the at least one redistribution line.

11. The package structure of claim 10, wherein the ESD-protection layer is located between the through-via and the sidewall of the semiconductor device.

12. The package structure of claim 10, wherein the ESD-protection layer is formed in the first dielectric layer or over the first dielectric layer, and a part of the at least one redistribution line is surrounded by the ESD-protection layer.

13. A package structure, comprising:
a semiconductor device;
a first molding compound in contact with a sidewall of the semiconductor device;
a through-via in the first molding compound, wherein the through-via is electrically connected to the semiconductor device;
first and second dielectric layers at upper and lower sides of the semiconductor device;
at least one redistribution line in the first and second dielectric layers, wherein the at least one redistribution line is electrically connected to the semiconductor device and the through-via; and
a second molding compound in contact with a sidewall of the first dielectric layer;
wherein the at least one redistribution line comprises a MIM (metal-insulator-metal) feature and the MIM feature is a capacitor structure;
wherein the at least one redistribution line has a first section and a second section, the first section and the second section of the at least one redistribution line are separated by a dielectric part, the first section is electrically connected to the semiconductor device, the second section is electrically connected to the through-via, and the capacitor structure is connected to the first section and the second section;
wherein the capacitor structure is arranged horizontally;
wherein a height of the first section of the at least one redistribution line is the same as a height of the second section of the at least one redistribution line.

14. The package structure of claim 13, wherein the first section of the at least one redistribution line is lower than the second section of the at least one redistribution line.

15. The package structure of claim 13, wherein the first section of the at least one redistribution line is higher than the second section of the at least one redistribution line.

* * * * *